(12) United States Patent
Sardesai

(10) Patent No.: US 9,105,614 B2
(45) Date of Patent: Aug. 11, 2015

(54) LOCAL INTERCONNECTS COMPATIBLE WITH REPLACEMENT GATE STRUCTURES

(71) Applicant: International Business Machines Corporation, Armonk, NY (US)

(72) Inventor: Viraj Y. Sardesai, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/187,392

(22) Filed: Feb. 24, 2014

(65) Prior Publication Data

US 2014/0167176 A1    Jun. 19, 2014

Related U.S. Application Data

(62) Division of application No. 13/351,294, filed on Jan. 17, 2012, now Pat. No. 8,741,718.

(51) Int. Cl.
*H01L 21/70* (2006.01)
*H01L 23/48* (2006.01)
*H01L 21/8234* (2006.01)

(52) U.S. Cl.
CPC ...... *H01L 23/481* (2013.01); *H01L 21/823425* (2013.01); *H01L 21/823437* (2013.01); *H01L 21/823475* (2013.01); *H01L 2924/0002* (2013.01)

(58) Field of Classification Search
USPC ......... 438/104, 123, 270, 287, 382, 591, 118, 438/122, 126, 172, 197, 233, 3, 478, 585; 257/43, E21.19, E27.06, E21.158, 257/E21.506, E23.031, E29.255, 295, 368, 257/369, 410, 666, 676, E21.09, E21.24
See application file for complete search history.

(56) References Cited

U.S. PATENT DOCUMENTS

| 5,966,597 | A | 10/1999 | Wright |
| 6,133,105 | A | 10/2000 | Chen et al. |
| 6,333,247 | B1 | 12/2001 | Chan et al. |
| 6,372,566 | B1 | 4/2002 | Kittl et al. |
| 7,256,125 | B2 | 8/2007 | Yamada et al. |
| 7,279,430 | B2 | 10/2007 | Chang et al. |
| 7,598,545 | B2 | 10/2009 | Cartier et al. |
| 7,763,540 | B2 | 7/2010 | Johnson et al. |
| 8,803,245 | B2 * | 8/2014 | Sell et al. ............ 257/384 |
| 2002/0036347 | A1 | 3/2002 | Houston |
| 2009/0081836 | A1 * | 3/2009 | Liu et al. ............ 438/229 |

(Continued)

*Primary Examiner* — Robert Bachner
(74) *Attorney, Agent, or Firm* — Scully, Scott, Murphy & Presser, P.C.; Yuanmin Cai

(57) ABSTRACT

After forming replacement gate structures that are embedded in a planarized dielectric layer on a semiconductor substrate, a contact-level dielectric layer is deposited over a planar surface of the planarized dielectric layer and the replacement gate structures. Substrate contact via holes are formed through the contact-level dielectric layer and the planarized dielectric layer, and metal semiconductor alloy portions are formed on exposed semiconductor materials. Gate contact via holes are subsequently formed through the contact-level dielectric layer. The substrate contact via holes and the gate contact via holes are simultaneously filled with a conductive material to form substrate contact structures and gate contact structures. The substrate contact structures and gate contact structures can be employed to provide local interconnect structures that provide electrical connections between two components that are laterally spaced on the semiconductor substrate.

12 Claims, 15 Drawing Sheets

(56) References Cited

U.S. PATENT DOCUMENTS

| | | | |
|---|---|---|---|
| 2009/0321942 A1* | 12/2009 | Sell et al. | 257/763 |
| 2010/0052166 A1 | 3/2010 | Mukherjee et al. | |
| 2011/0298017 A1* | 12/2011 | Jain et al. | 257/288 |
| 2012/0119302 A1 | 5/2012 | Pei et al. | |

* cited by examiner

LOCAL INTERCONNECTS COMPATIBLE WITH REPLACEMENT GATE STRUCTURES

CROSS REFERENCE TO RELATED APPLICATION

This application is a divisional of U.S. patent application Ser. No. 13/351,294, filed Jan. 17, 2012 the entire content and disclosure of which is incorporated herein by reference.

BACKGROUND

The present disclosure relates to semiconductor structures, and particularly to semiconductor structures including a metal-oxide-semiconductor field effect transistor (MOSFET), a substrate contact structure, and a gate contact structure, and methods of manufacturing the same.

As semiconductor devices shrink in each generation of semiconductor technology, formation of contact structures to source and drain regions and gate electrodes of a field effect transistor become challenging because such contact structures not only need to provide reliable electrical contact to the source and drain regions or the gate electrodes, but also need to avoid electrically shorting to other components or among themselves. The challenge is especially severe in replacement gate integration schemes, in which disposable gate structures are replaced with replacement gate structures including a high-k dielectric material gate dielectric and a metallic gate electrode. Sequentially forming different groups of contact structures can lead to electrical shorts among components due to lithographic misalignment during multiple lithographic exposure steps and distortion of patterns due to resist shadowing. Thus, a reliable metal interconnect structure that avoids electrical shorting and pattern distortion is desired.

SUMMARY

After forming replacement gate structures that are embedded in a planarized dielectric layer on a semiconductor substrate, a contact-level dielectric layer is deposited over a planar surface of the planarized dielectric layer and the replacement gate structures. Substrate contact via holes are formed through the contact-level dielectric layer and the planarized dielectric layer, and metal semiconductor alloy portions are formed on exposed semiconductor materials. Gate contact via holes are subsequently formed through the contact-level dielectric layer. The substrate contact via holes and the gate contact via holes are simultaneously filled with a conductive material to form substrate contact structures and gate contact structures. The substrate contact structures and gate contact structures can be employed to provide local interconnect structures that provide electrical connections between two components that are laterally spaced on the semiconductor substrate.

According to an aspect of the present disclosure, a method of forming a semiconductor structure is provided, which includes: forming a gate-level structure on a semiconductor substrate. A planar top surface of the gate-level structure contiguously extends over an entirety of the semiconductor substrate. The gate-level structure includes gate stacks of a gate dielectric and a gate electrode, gate spacers, and a planarized dielectric layer. The method further includes: forming a contact-level dielectric layer over the gate-level structure; forming a substrate contact via hole through a portion of the contact-level dielectric layer and a portion of the planarized dielectric layer to a semiconductor material portion located in or directly on the semiconductor substrate; forming a metal semiconductor alloy portion on the semiconductor material portion; forming a gate contact via hole through another portion of the contact-level dielectric layer overlying one of the gate electrodes; and forming a substrate contact structure directly on the metal semiconductor alloy portion and a gate contact structure directly on the one of the gate electrodes.

According to another aspect of the present disclosure, a method of forming a semiconductor structure is provided, which includes: forming a plurality of gate structures including a disposable material on a semiconductor substrate; depositing a dielectric layer over the gate structures and the semiconductor substrate; planarizing the dielectric layer to expose the plurality of gate structures; replacing the disposable material in the plurality of gate structures with a replacement gate material. Each of the plurality of the gate structures includes a stack of a gate dielectric and a gate electrode including the replacement gate material. Top surfaces of the gate electrodes are coplanar with a top surface of the planarized dielectric layer. The method further includes: forming a contact-level dielectric layer over the planarized dielectric layer; forming a substrate contact via hole through a portion of the contact-level dielectric layer and a portion of the planarized dielectric layer. The substrate contact via hole extends to a semiconductor material portion located in or directly on the semiconductor substrate. The method further includes: forming a metal semiconductor alloy portion on the semiconductor material portion; forming a gate contact via hole through another portion of the contact-level dielectric layer overlying one of the gate electrodes; and forming a substrate contact structure directly on the metal semiconductor alloy portion and a gate contact structure directly on the one of the gate electrodes.

According to yet another aspect of the present disclosure, a semiconductor structure is provided, which includes: a gate-level structure located on a semiconductor substrate. A planar top surface of the gate-level structure extends over an entirety of the semiconductor substrate, and the gate-level structure includes gate stacks of a gate dielectric and a gate electrode, gate spacers, and a planarized dielectric layer. The semiconductor structure further includes: a contact-level dielectric layer located over the gate-level structure; a metal semiconductor alloy portion located in or directly on the semiconductor substrate; a substrate contact structure embedded in the contact-level dielectric layer and in contact with the metal semiconductor alloy portion and at least one of the gate spacers; and a gate contact structure embedded in the contact-level dielectric layer and in contact with a top surface of one of the gate electrodes.

According to still another aspect of the present disclosure, a semiconductor structure is provided, which includes: gate structures including a stack of a gate dielectric and a gate electrode and located on a semiconductor substrate; and a dielectric layer located on the semiconductor substrate. Top surfaces of the gate structures are coplanar with a top surface of the dielectric layer. The semiconductor structure further includes: a contact-level dielectric layer located over the dielectric layer and the gate structures; a metal semiconductor alloy portion located in or directly on the semiconductor substrate; a substrate contact structure embedded in the contact-level dielectric layer and in contact with the metal semiconductor alloy portion and at least one of the gate spacers; and a gate contact structure embedded in the contact-level dielectric layer and in contact with a top surface of one of the gate electrodes.

DETAILED DESCRIPTION

Figure 1:
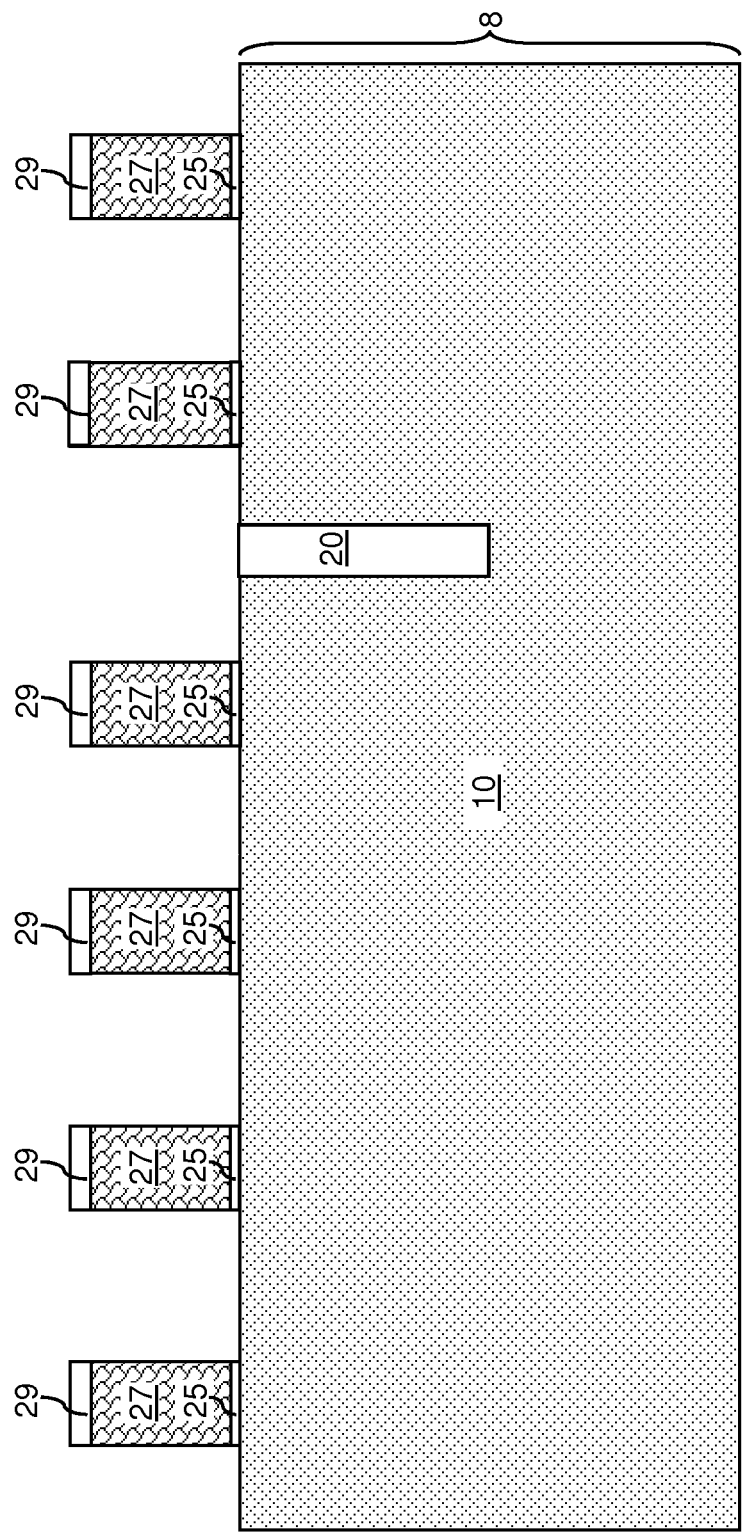
FIG. 1 is vertical cross-sectional view of an exemplary semiconductor structure after formation of disposable gate structures according to an embodiment of the present disclosure.

As stated above, the present disclosure relates to semiconductor structures including a metal-oxide-semiconductor field effect transistor (MOSFET), a substrate contact structure, and a gate contact structure, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor substrate 8 that includes a semiconductor material layer 10. Various semiconductor devices including at least one field effect transistor can be subsequently formed on the semiconductor material layer 10. The semiconductor substrate 8 can be a bulk substrate including a bulk semiconductor material constituting the semiconductor material layer 10 throughout, or a semiconductor-on-insulator (SOI) substrate (not shown) containing a top semiconductor layer that constitutes a semiconductor material layer, a buried insulator layer (not shown) located under the top semiconductor layer, and a bottom semiconductor layer (not shown) located under the buried insulator layer.

Various portions of the semiconductor material in the semiconductor substrate 8 can be doped with electrical dopants of p-type or n-type at different dopant concentration levels. For example, the semiconductor substrate 8 may include at least one p-type well (not shown) and/or at least one n-type well (not shown). At least one shallow trench isolation structure 20 can be formed to laterally separate various surface regions of the semiconductor substrate 8. For example, the at least one shallow trench isolation region 20 can be formed when two laterally adjoining devices need to be electrically isolated.

A disposable dielectric layer and a disposable gate material layer are deposited on the top surface of the semiconductor substrate 8. The disposable dielectric layer includes a dielectric material such as a semiconductor oxide, a semiconductor nitride, or a semiconductor oxynitride. For example, the disposable dielectric layer can include silicon oxide, silicon nitride, or silicon oxynitride.

The disposable gate material layer includes a material that can be subsequently removed selective to dielectric materials of the gate spacer and a planarization dielectric layer, i.e., a dielectric layer to be subsequently deposited at the level of the disposable dielectric layer and the disposable gate material layer. For example, the disposable gate material layer includes a semiconductor material such as silicon, germanium, a silicon germanium alloy, a compound semiconductor material. Alternately, the disposable gate material layer can include any dielectric material or any metallic material that can be removed selective to the dielectric materials of the gate spacer and the dielectric layer to be subsequently deposited.

Optionally, a disposable gate cap dielectric layer including a dielectric material can be deposited on the disposable gate material layer. The disposable gate cap dielectric layer includes a dielectric material that can be removed selective to the gate spacer and the dielectric layer to be subsequently deposited. For example, the disposable gate cap dielectric layer can include silicon nitride. The total thickness of the stack of the disposable dielectric layer, the disposable gate material layer, and the optional disposable gate cap dielectric layer can be from 50 nm to 500 nm, although lesser and greater thicknesses can also be employed.

The stack of the disposable dielectric layer, the disposable gate material layer, and the optional disposable gate cap dielectric layer is subsequently lithographically patterned to form disposable gate structures. Each disposable gate stack includes a disposable dielectric portion 25, which is a remaining portion of the disposable dielectric layer, and a disposable gate material portion 27, which is a remaining portion of the disposable gate material layer. Each disposable gate stack may optionally include a disposable gate cap dielectric portion 29, which is a remaining portion of the disposable gate cap dielectric layer.

Figure 2:
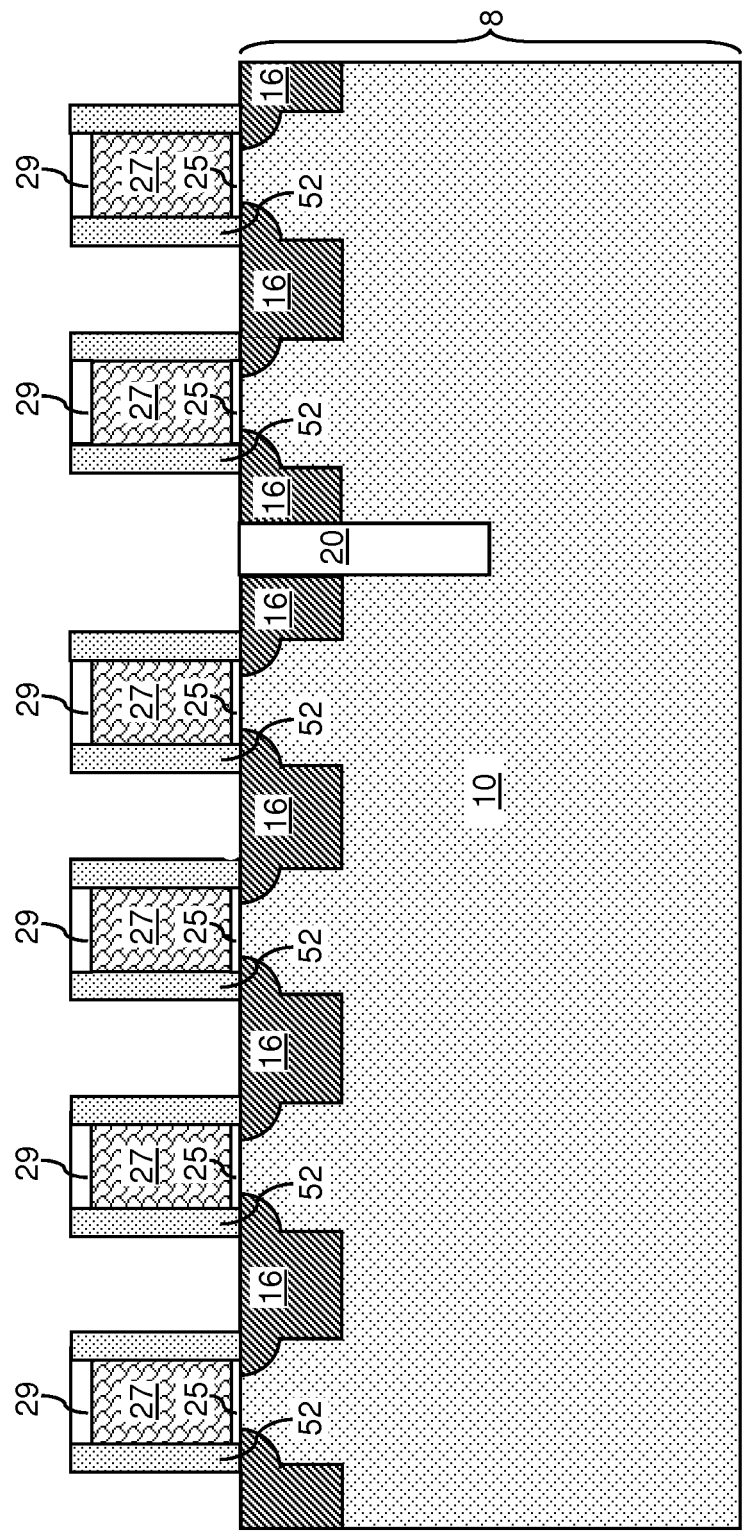
FIG. 2 is vertical cross-sectional view of the exemplary semiconductor structure after formation of source/drain regions and gate spacers according to an embodiment of the present disclosure.

Referring to FIG. 2, dopants of the various conductivity types (p-type and n-type) are implanted into various portions of the semiconductor substrate 8 that are not covered by an extension masking structure during ion implantation. During each round of ion implantation, a combination of a patterned photoresist (not shown) and the disposable gate structure (25, 27, 29) can be employed as the extension masking structure. Multiple patterned photoresists can be employed in combination with multiple ion implantation steps to form various source/drain extension regions (not explicitly shown) having different dopant types and/or different dopant concentrations. As used herein, a "source/drain extension region" can be a source extension region or a drain extension region of a field effect transistor.

Gate spacers 52 are formed on sidewalls of each of the disposable gate structures (25, 27, 29), for example, by deposition of a conformal dielectric material layer and an anisotropic etch. The gate spacers 52 include a dielectric material that is different from the dielectric material of the planarization dielectric layer to be subsequently deposited and planarized.

Dopants of the various conductivity types (p-type and n-type) are implanted into various portions of the semiconductor substrate 8 that are not covered by a source/drain masking structure during ion implantation. During each round of ion implantation, a combination of a patterned photoresist (not shown), the disposable gate structure (25, 27, 29), and the gate spacers 52 can be employed as the source/drain masking structure. Multiple patterned photoresists can be employed in combination with multiple ion implantation steps to form various deep source/drain regions having different dopant types and/or different dopant concentrations. As used herein, a "deep source/drain region" can be a deep source region having a greater depth than a source extension region or a deep drain region having a greater depth than a drain extension region in a field effect transistor. The preexisting source/drain extension regions and the deep source/drain regions are merged to form various source/drain regions 16. Thus, at least a portion of the source/drain regions 16 is formed after formation of the gate spacers 52.

Figure 3:
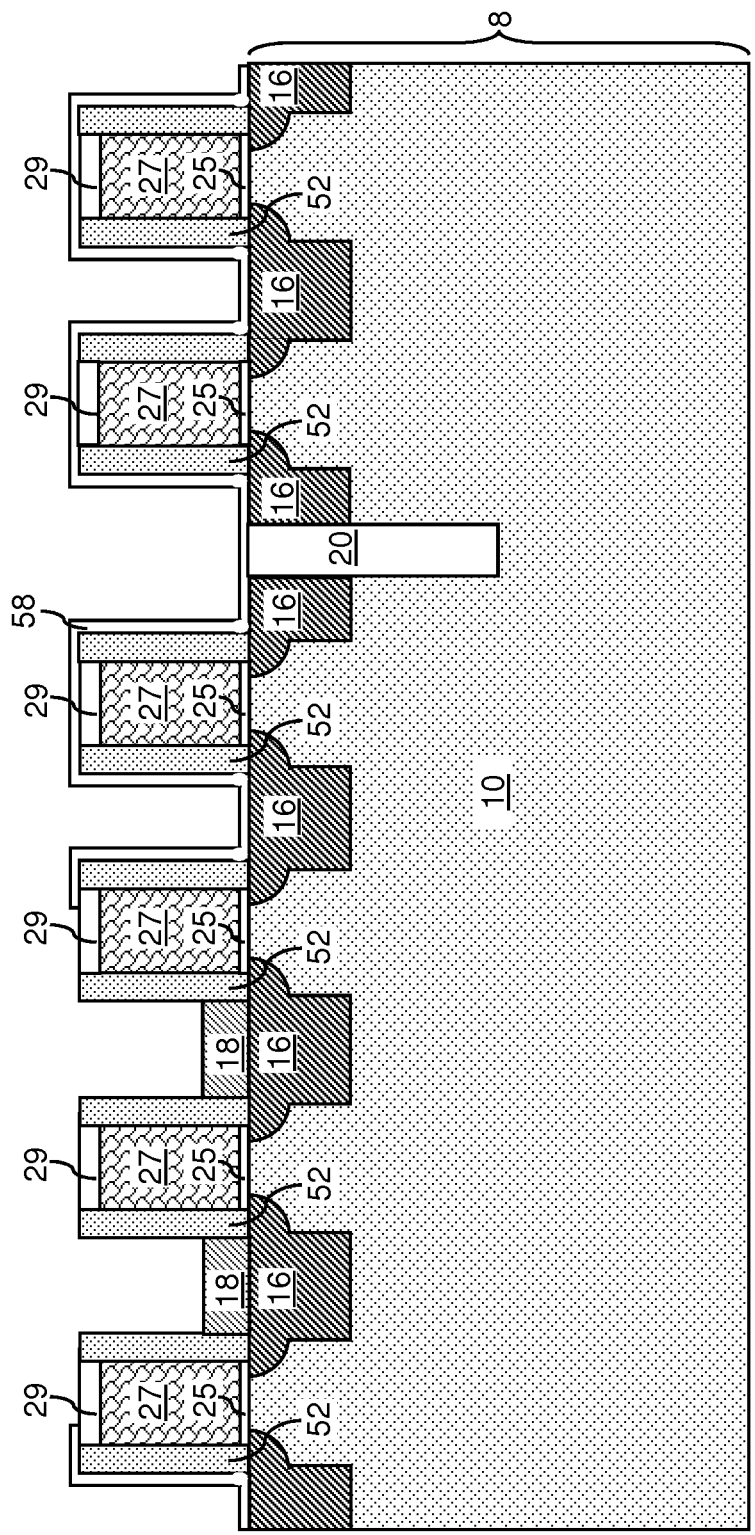
FIG. 3 is a vertical cross-sectional view of the exemplary semiconductor structure after deposition of a dielectric mask layer, patterning of the dielectric mask layer, and formation of raised source/drain regions by selective deposition according to an embodiment of the present disclosure.

Referring to FIG. 3, a dielectric mask layer 58 can be deposited as a conformal layer. The dielectric mask layer 58 is subsequently patterned so that semiconductor surfaces are physically exposed in regions in which selective deposition of an additional semiconductor material is desired, while remaining portions of the dielectric mask layer 58 cover regions in which deposition of the additional semiconductor material is not desired. The dielectric mask layer 58 can include silicon oxide, silicon nitride, and/or silicon oxynitride. The thickness of the dielectric mask layer 58 can be from 2 nm to 10 nm, although lesser and greater thicknesses can also be employed.

Raised source/drain regions 18 can be formed by selective deposition of a semiconductor material on exposed semiconductor surfaces, while the semiconductor material is not deposited on dielectric surfaces including the surfaces covered by the dielectric mask layer 58, the gate spacers 52, or the disposable gate cap dielectric portions 29. As used herein, a "raised source/drain region" refers to a source region located above a bottommost surface of a gate dielectric or a drain region located above the bottommost surface of the gate dielectric.

The raised source/drain regions 18 can have the same semiconductor material as, or a semiconductor material different from, the semiconductor material of the semiconductor substrate 8. The raised source/drain regions 18 can be formed, for example, by selective epitaxy of a semiconductor material. Thus, if the semiconductor material layer 10 includes a single crystalline semiconductor material, the semiconductor material of the raised source/drain regions 18 can be epitaxially aligned to the single crystalline semiconductor material of the semiconductor material layer 10 within the semiconductor substrate 8. Optionally, raised source/drain regions can be deposited selectively on some devices (as shown in FIG. 3). In one embodiment, a first semiconductor material deposited for raised source/drain regions on n-doped semiconductor regions can be different from a second semiconductor material deposited for raised source/drain regions on p-doped semiconductor regions.

The deposited semiconductor material of the raised source/drain regions can be in-situ doped or doped after deposition by ion implantation. The dielectric mask layer 58 is subsequently removed, for example, by a wet etch. The thickness of the raised source/drain regions 18 can be from 3 nm to 60 nm, although lesser and greater thicknesses can also be employed. Multiple dielectric mask layers 58 and multiple selective depositions can be employed.

Figure 4:
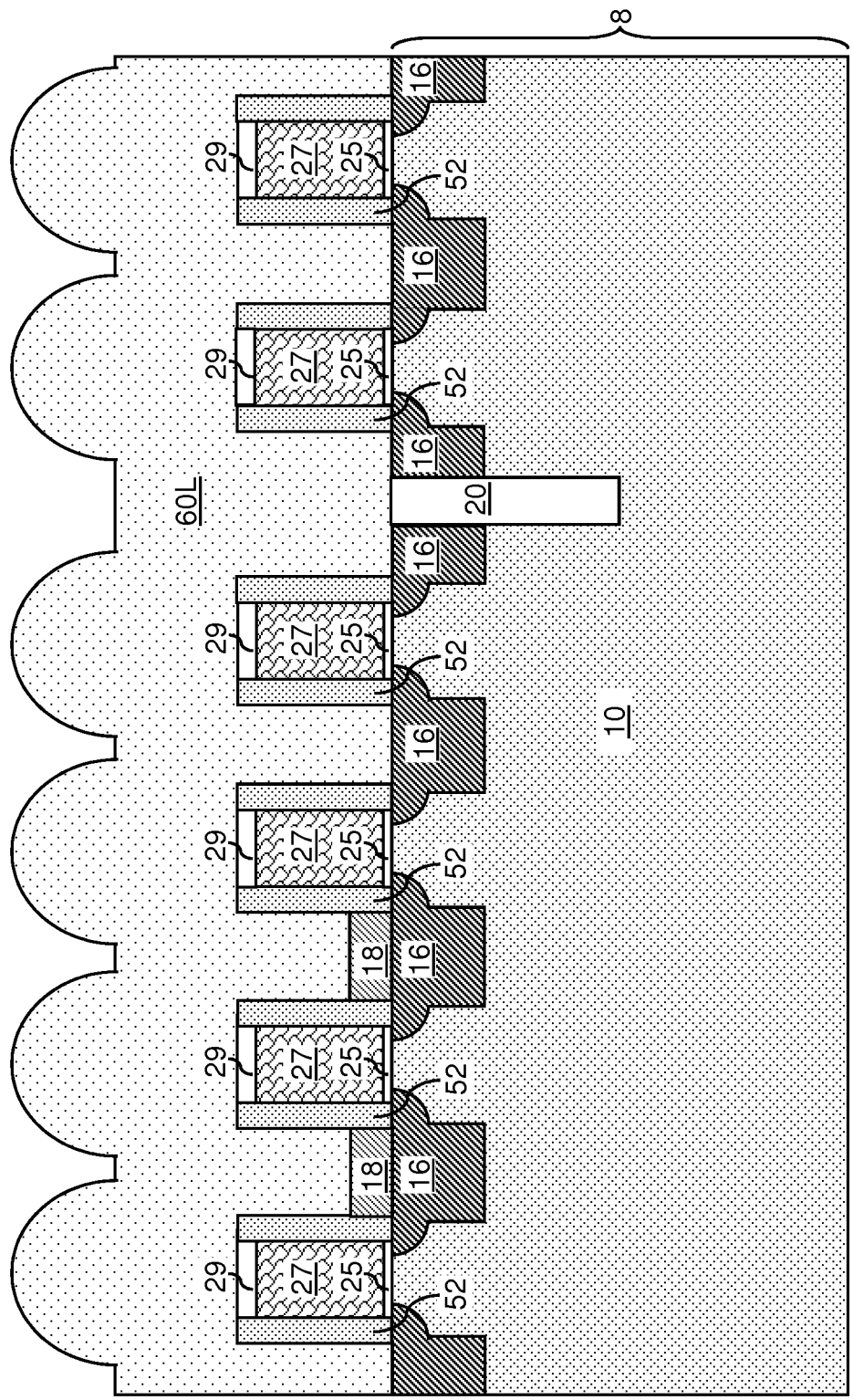
FIG. 4 is a vertical cross-sectional view of the exemplary semiconductor structure after removal of the patterned dielectric mask layer and deposition of a dielectric layer according to an embodiment of the present disclosure.

Referring to FIG. 4, a dielectric layer is deposited over the semiconductor substrate 8, the disposable gate stacks (25, 27, 29), and the gate spacers 52. The dielectric layer is herein referred to as a planarization dielectric layer 60L, which is subsequently planarized to provide a planar top surface. The planarization dielectric layer 60L fills the gaps between adjacent pairs of gate spacers 52.

The planarization dielectric layer 60L includes a dielectric material that is different from the dielectric material of the gate spacers 52 and the dielectric material of the disposable gate cap dielectric portions 29. For example, the gate spacers 52 and the disposable gate cap dielectric portions 29 can include silicon nitride, and the planarization dielectric layer 60L can include silicon oxide.

Figure 5:
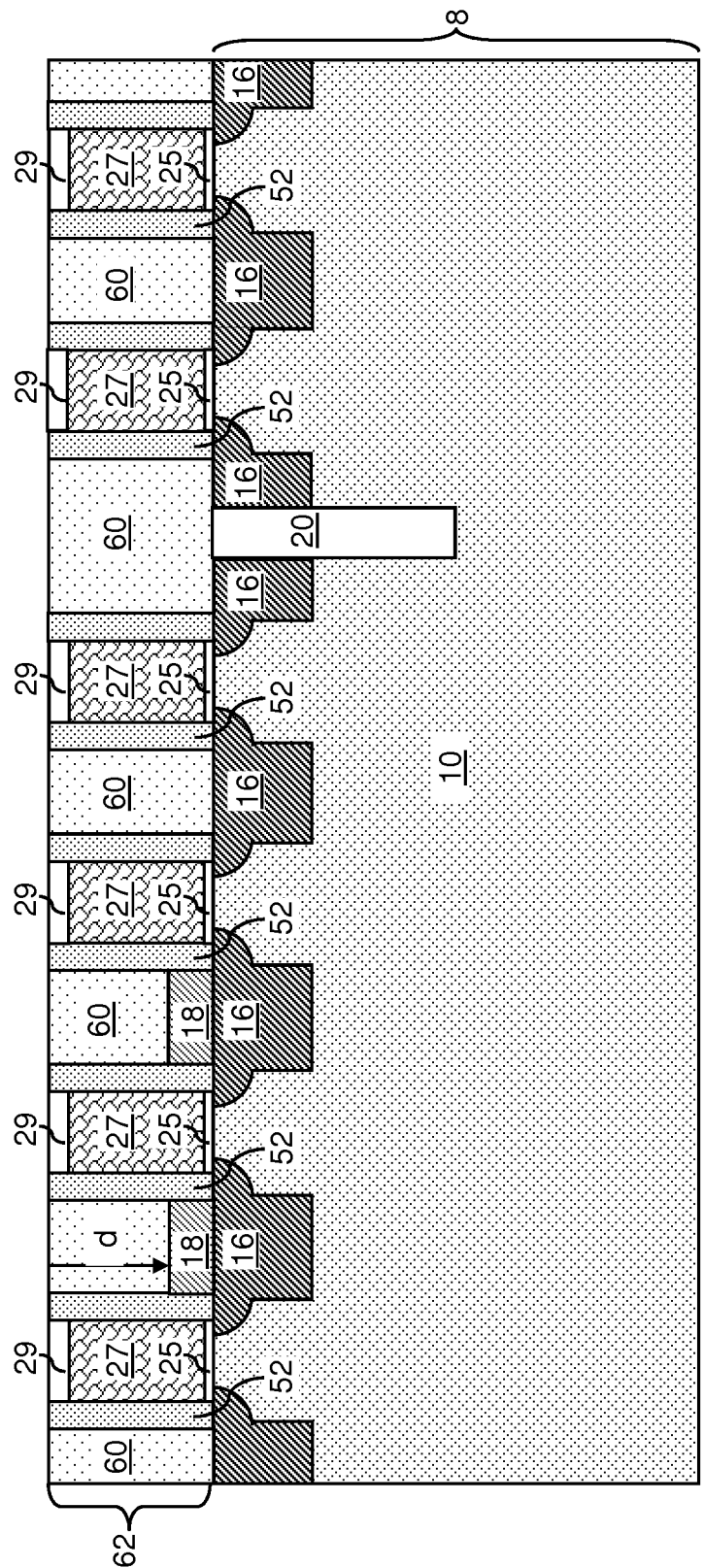
FIG. 5 is a vertical cross-sectional view of the exemplary semiconductor structure after planarizing the dielectric layer according to an embodiment of the present disclosure.

Referring to FIG. 5, the planarization dielectric layer 60L is planarized so that a planar top surface of the planarization dielectric layer 60L as planarized is coplanar with top surfaces of the disposable gate stacks (25, 27, 29). The planarization dielectric layer 60L as planarized is herein referred to as a planarized dielectric layer 60.

A gate-level structure 62 is formed on the semiconductor substrate 8. The gate-level structure 62 is located between the top surface of the semiconductor substrate 8, which is coplanar with bottommost surfaces of the disposable gate stacks (25, 27, 29), and the planar top surface of the planarized dielectric layer 60. The gate-level structure 62 includes the disposable gate stacks (25, 27, 29), the gate spacers 52, the planarized dielectric layer 60, and the raised source/drain regions 18. The disposable gate stacks (25, 27, 29), the gate spacers 52, and the planarized dielectric layer 60 complementarily fill portions of the gate-level structure (25, 27, 29, 52, 60, 18) that is within a distance d from the planar top surface of the gate-level structure (25, 27, 29, 52, 60, 18). The distance d is the vertical distance between the planar top surface of the planarized dielectric layer 60 and the top surfaces of the raised source/drain regions 18. In other words, the disposable gate stacks (25, 27, 29), the gate spacers 52, and the planarized dielectric layer 60 complementarily fill portions of the gate-level structure (25, 27, 29, 52, 60, 18) that is located above the raised source/drain regions 18. The planar top surface of the gate-level structure 62 extends over an entirety of the gate-level structure (25, 27, 29, 52, 60, 18).

Figure 6:
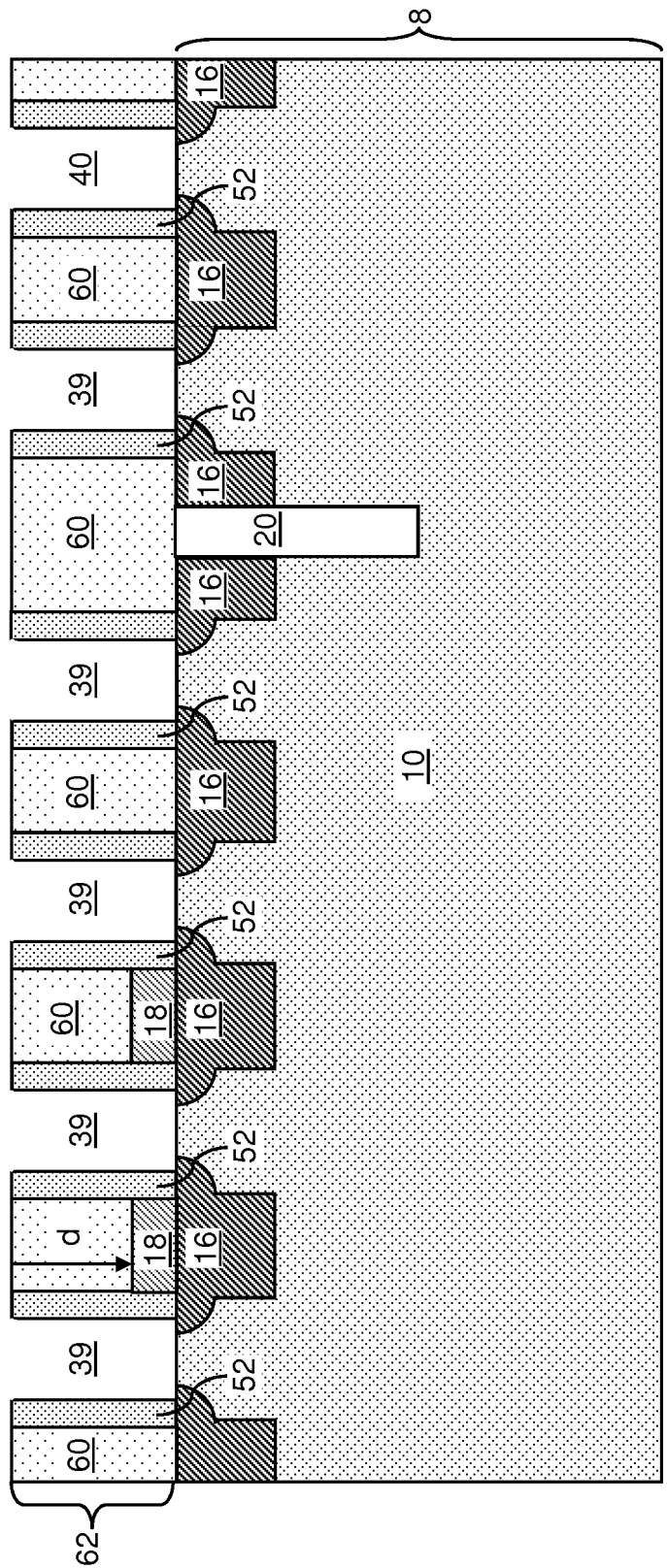
FIG. 6 is a vertical cross-sectional view of the exemplary semiconductor structure after removal of the disposable gate structures according to an embodiment of the present disclosure.

Referring to FIG. 6, the disposable gate structures (25, 27, 29) are removed by at least one etch. The at least one etch can include a recess etch, which can be an isotropic etch or anisotropic etch. The etch employed to remove the disposable gate material portions (25, 27, 29) is selective to the dielectric materials of the planarized dielectric layer 60 and the gate spacers 52. Gate cavities 39 are formed in volumes from which the disposable gate structures (25, 27, 29) are removed. Semiconductor surfaces of the semiconductor material layer 10 are physically exposed below each gate cavity 39. The gate-level structure 62 includes gate cavities 39, the gate spacers 52, the planarized dielectric layer 60, and the raised source/drain regions 18 at the end of the processing steps of FIG. 6.

Figure 7:
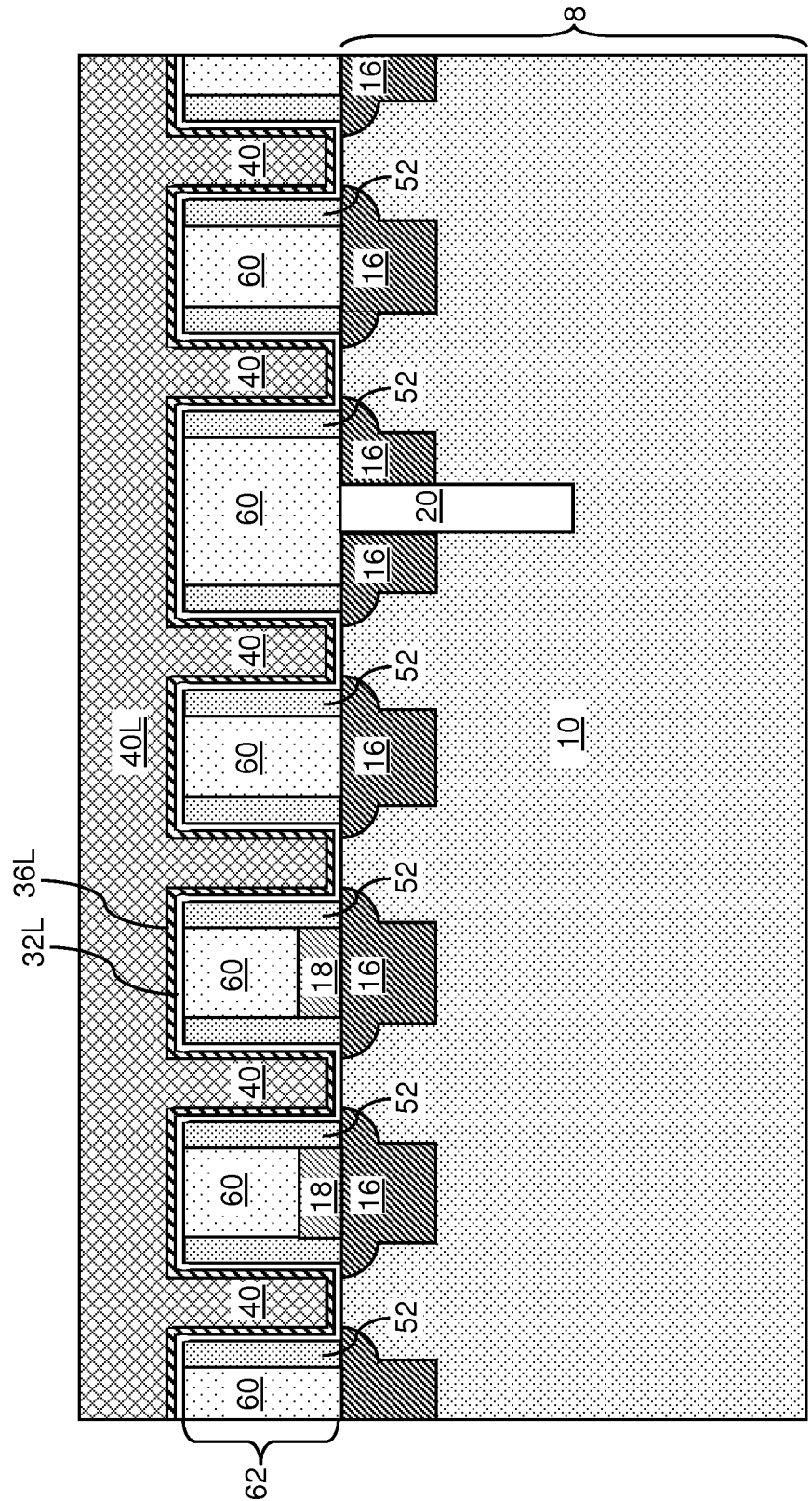
FIG. 7 is a vertical cross-sectional view of the exemplary semiconductor structure after deposition of a gate dielectric layer and a gate conductor layer according to an embodiment of the present disclosure.

Referring to FIG. 7, a contiguous gate dielectric layer 32L, at least one work function metal layer 36L, and a gate conductor layer 40L are sequentially deposited in the gate cavities 39 and over the top surfaces of the planarized dielectric layer 60 and the gate spacers 52. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm.

The at least one work function metal layer 36L includes a metal that can optimize the threshold voltages of transistors. For example, the at least one work function metal layer 36L can include metals such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. The at least one work function metal layer 36L can be formed, for example, by physical vapor deposition, chemical vapor deposition, or atomic layer deposition (ALD). The thickness of the at least one work function metal layer 36L can be from 2 nm to 40 nm, although lesser and greater thicknesses can also be employed.

A gate conductor layer 40L is deposited on the at least one work function metal layer 36L. The gate conductor layer 40L includes a conductive material, which can be deposited by physical vapor deposition or chemical vapor deposition. For example, the gate conductor layer 40L can be an aluminum layer or an aluminum alloy layer deposited by physical vapor deposition. The thickness of the gate conductor layer 40L, as measured in a planar region of the conductive metal layer 40L above the top surface of the planarized dielectric layer 60, can be from 100 nm to 500 nm, although lesser and greater thicknesses can also be employed. In one embodiment, the gate conductor layer 40L consists essentially of a single elemental metal such as Al, Au, Ag, Cu, or W.

Lower portions of the continuous gate dielectric layer 32L, lower portions of the at least one work function metal layer 36L, lower portions of the gate conductor layer 40L, the gate spacers 52, the planarized dielectric layer 60, and the raised source/drain regions 18 complimentarily fill the gate-level structure 62 at the end of the processing steps of FIG. 7.

Figure 8:
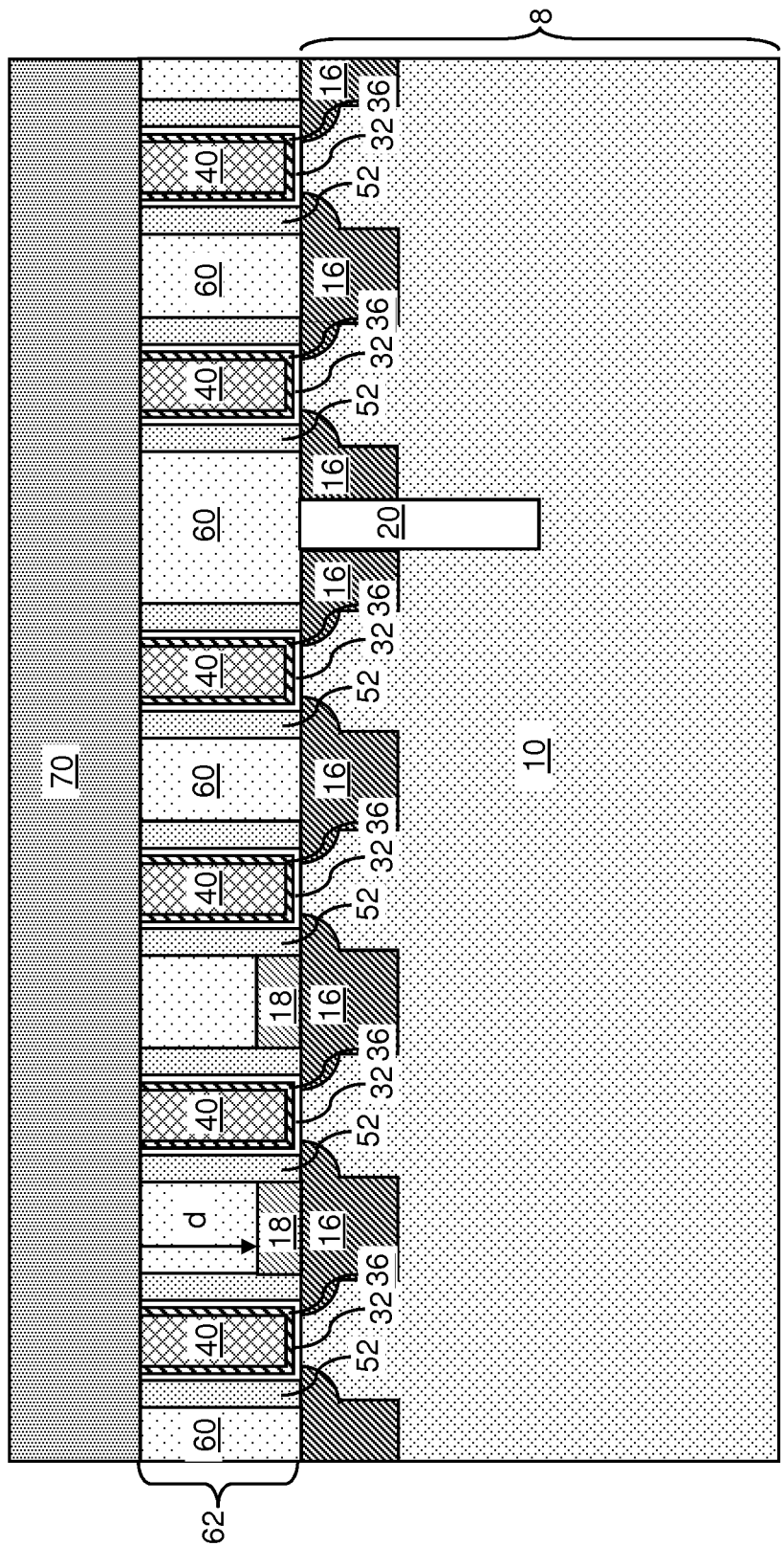
FIG. 8 is a vertical cross-sectional view of the exemplary semiconductor structure after formation of replacement gate structures by planarization and subsequent deposition of a contact-level dielectric layer according to an embodiment of the present disclosure.

Referring to FIG. 8, portions of the gate conductor layer 40L, portions of the at least one work function metal layer 36L, and portions the contiguous gate dielectric layer 32L are removed from above the top planar surface of the planarization dielectric layer 60 by performing a planarization process such as chemical mechanical planarization (CMP). Replacement gate stacks are formed within volumes that are previously occupied by disposable gate stacks (25, 27, 29; See FIGS. 1-5). Each replacement gate stack is a gate stack that remains permanently on the semiconductor substrate 8, i.e., is not disposable.

Each replacement gate stack includes a gate dielectric 32, a work function metal portion 36, and a gate conductor 40. A stack of a work function metal portion 36 and a gate conductor 40 constitutes a gate electrode (36, 40).

Each gate dielectric 32 is a remaining portion of the contiguous gate dielectric layer 32L after the planarization process. Each work function metal portion 36 is a remaining portion of the at least one work function metal layer 36L after the planarization process. Each gate conductor 40 is a remaining portion of the gate conductor layer 40L after the planarization process. Each replacement gate stack (32, 36, 40) can overlie a channel region of a field effect transistor.

Each gate dielectric 32 can be a U-shaped gate dielectric contacting the semiconductor material of the semiconductor material layer 10 and the inner surfaces of a gate spacer 52. Because the gate dielectrics 32 include the same material as the contiguous gate dielectric layer 32L (See FIG. 7), the gate dielectrics 32 can be U-shaped gate dielectrics including a dielectric material having a dielectric constant greater than 8.0. The U-shaped gate dielectrics include vertical portions, which have top surfaces that are coplanar with the top surface of the planarized dielectric layer 60.

Each work function metal portion 36 can be a U-shaped work function metal portion contacting the inner surfaces of the vertical portions of the gate dielectrics 32 and the top surfaces of the horizontal portions of the gate dielectrics 32. The U-shaped work function metal portions include vertical portions, which have top surfaces that are coplanar with the top surface of the planarized dielectric layer 60 and the top surfaces of the vertical portions of the U-shaped gate dielectrics.

Each gate conductor 40 has a top surface that is coplanar with the top surface of the planarized dielectric layer 60, the top surfaces of the vertical portions of the U-shaped gate dielectrics, and the top surfaces of the vertical portions of the U-shaped work function metal portions.

The gate-level structure 62 includes replacement gate stacks (32, 36, 40), the gate spacers 52, the planarized dielectric layer 60, and the raised source/drain regions 18 at the end of the processing steps of FIG. 8. The planar top surface of the gate-level structure 62 extends over the entirety of the gate-level structure 62. The replacement gate stacks (32, 36, 40), the gate spacers 52, and the planarized dielectric layer 60 complementarily fill portions of the gate-level structure (32, 36, 40, 52, 60, 18) that is within the distance d from the planar top surface of the gate-level structure (32, 36, 40, 52, 60, 18). Thus, the disposable gate structures (25, 27, 29) in the exemplary semiconductor structure in FIG. 5 is replaced with replacement gate structures (32, 36, 40) in the exemplary semiconductor structure of FIG. 8. Each replacement gate stack (32, 36, 40) includes a stack of a gate dielectric 32 and a gate electrode (36, 40). Top surfaces of the replacement gate structures (32, 36, 40) are coplanar with a top surface of the planarized dielectric layer 60.

A contact-level dielectric layer 70 is deposited over the planarized dielectric layer 60, the gate spacers 52, and the replacement gate structures (32, 36, 40) as a blanket layer, i.e., a layer without a pattern. The contact-level dielectric layer 70 includes a dielectric material such as silicon oxide, silicon nitride, and/or porous or non-porous organosilicate glass. The contact-level dielectric layer 70 can be deposited, for example, by chemical vapor deposition (CVD) or spin coating. Because the entirety of the top surface of the gate-level structure 62 is planar, the entirety of the contact-level dielectric layer 70 is planar. Consequently, the entirety of the contact-level dielectric layer 70 has the same thickness. The thickness of the contact-level dielectric layer 70 can be from 30 nm to 600 nm, although lesser and greater thicknesses can also be employed.

Figure 9:
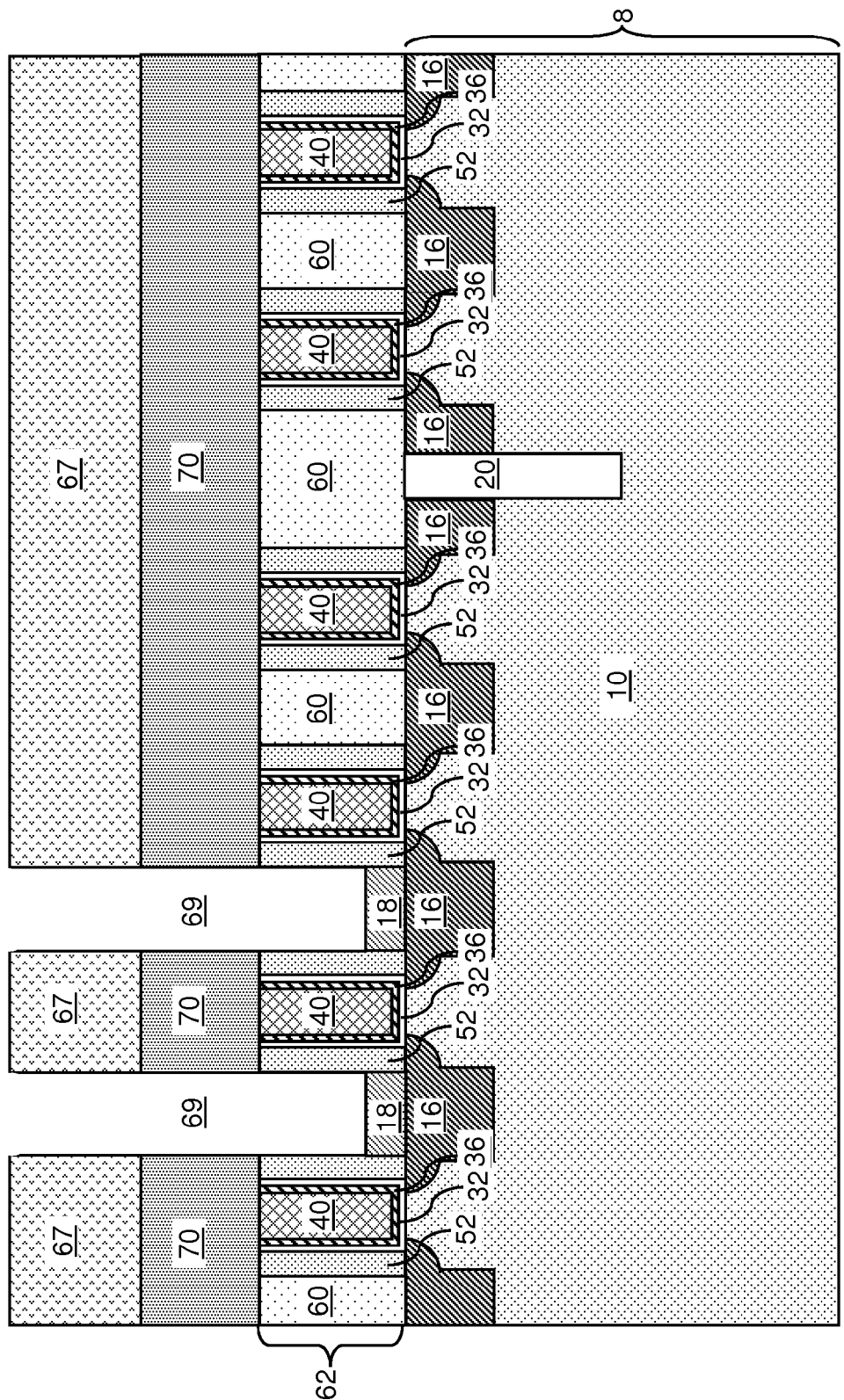
FIG. 9 is a vertical cross-sectional view of the exemplary semiconductor structure after application and patterning of a first photoresist, and transfer of the pattern in the first photoresist into the contact-level dielectric layer and planarized dielectric layer to form substrate contact via holes according to an embodiment of the present disclosure. A disposable hard mask may be used to assist in patterning of substrate contacts.

Referring to FIG. 9, a first photoresist 67 is applied over the contact-level dielectric layer 70 and lithographically patterned to form openings therein. In one embodiment, the openings in the first photoresist 67 are formed in areas that do not overlie the replacement gate stacks (32, 36, 40). The pattern in the first photoresist 67 is transferred through the entire thickness of the contact-level dielectric layer 70 and the planarized dielectric layer 60 until at least one semiconductor surface is physically exposed. A substrate contact via hole 69 is formed underneath each opening in the first photoresist within the contact-level dielectric layer 70 and the planarized dielectric layer 60.

Each physically exposed semiconductor surface at the bottom of each substrate contact via hole 69 can be a top surface of a raised source/drain region 18 located on, and above, the semiconductor substrate 8, or can be a top surface of a semiconductor portion of the semiconductor material layer 10 located within the semiconductor substrate 8. Thus, each substrate contact via hole 69 is formed through a portion of the contact-level dielectric layer 70 and a portion of the planarized dielectric layer 60 to a semiconductor material portion located in or directly on the semiconductor substrate 8.

In one embodiment, the etch process employed to remove the planarized dielectric layer 60 can be selective to the dielectric material of the gate spacers 52. In such cases, the substrate contact via holes 69 can be self-aligned to the gate spacers 52, i.e., the outer periphery of the lower portion of the substrate contact via holes 69 can coincide with the pre-existing outer surfaces of the gate spacers 52.

Figure 10:
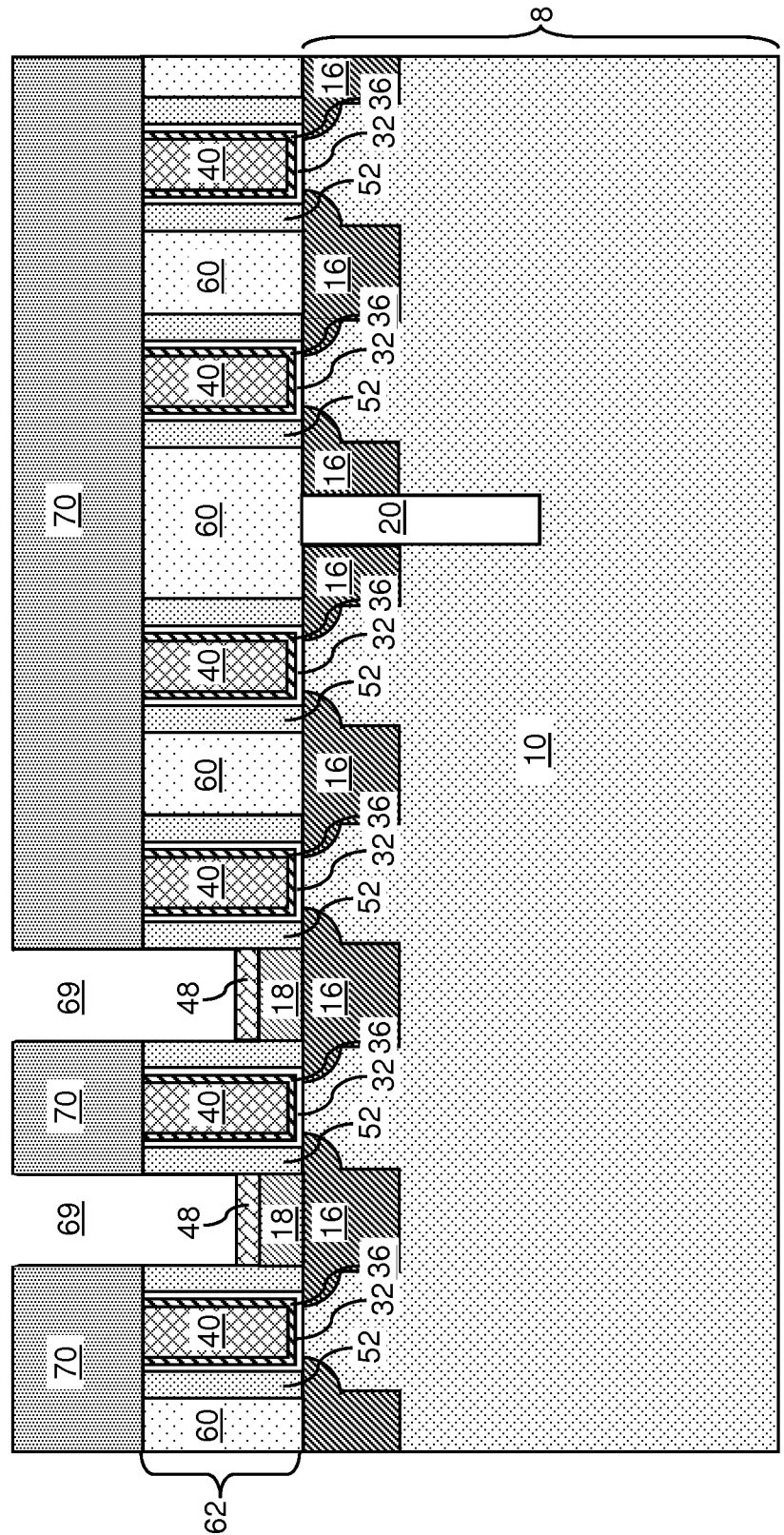
FIG. 10 is a vertical cross-sectional view of the exemplary semiconductor structure after formation of metal semiconductor alloy portions at bottom portions of the substrate contact via holes according to an embodiment of the present disclosure.

Referring to FIG. 10, the first photoresist 67 is removed, for example, by ashing. Metal semiconductor alloy portions 48 can be formed on exposed semiconductor material portions, which can include the raised source/drain regions 18 and/or physically exposed surface portions (not shown) of the semiconductor material layer 10.

Specifically, a metal layer (not shown) is deposited directly on the exposed semiconductor material portions. The material of the metal layer can be, for example, W, Ti, Ta, Ni, or a combination thereof. Subsequently, the metal layer is reacted with the semiconductor material portion at an elevated temperature, which can be, for example, in the range from 400° C. to 700° C. The metal in the metal layer reacts with the underlying semiconductor material to form metal semiconductor alloy portions 48. Each metal semiconductor alloy portion 48 can be located directly on the raised source/drain regions 18, or can be located directly on a surface portion of the semiconductor material layer 10 within the semiconductor substrate 8. Unreacted portions of the metal layer are removed selective to the metal semiconductor alloy portions 48. The thickness of the metal semiconductor alloy portions 48 can be from 4 nm to 80 nm, although lesser and greater thicknesses can also be employed.

Figure 11:
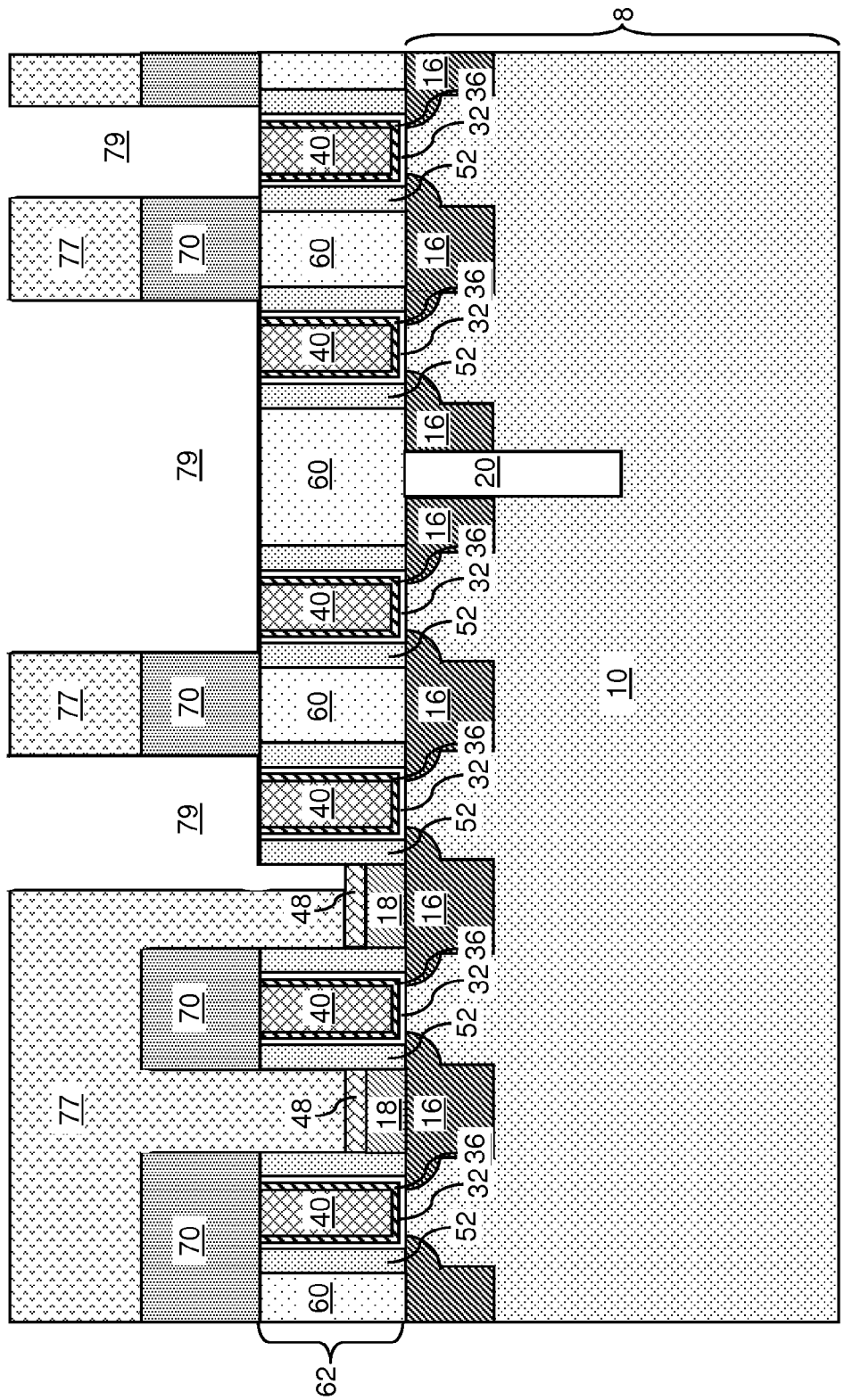
FIG. 11 is a vertical cross-sectional view of the exemplary semiconductor structure after application and patterning of a second photoresist, and transfer of the pattern in the second photoresist into the contact-level dielectric layer to form gate contact via holes according to an embodiment of the present disclosure.

Referring to FIG. 11, a second photoresist 77 is applied over the contact-level dielectric layer 70 and lithographically patterned to form openings therein. Each opening in the second photoresist 77 may be laterally offset from the substrate contact via holes 69, may partially overlie one of the substrate contact via holes 69, or may include one or more of the substrate contact via holes 69.

The pattern in the second photoresist 77 is transferred through the entire thickness of the contact-level dielectric layer 70 until the top surface of the planarized dielectric layer 60 is physically exposed. A gate contact via hole 79 is formed underneath each opening in the second photoresist within the contact-level dielectric layer 70. One or more replacement gate stacks (32, 36, 40) may, or may not, be physically exposed within each gate contact via hole 79. In one embodiment, at least one gate contact via hole 79 is formed through a portion of the contact-level dielectric layer 70 overlying one of the replacement gate electrodes (32, 26, 40) and not overlying the substrate contact via holes 69.

If an opening in the second photoresist 77 overlies one of the substrate contact via holes 69, the gate contact via hole 79 underlying such an opening is merged with the pre-existing substrate contact via hole 69 to form a composite contact via hole, which is a merged contiguous via hole that occupies the volumes of the substrate contact via hole 69 and the gate contact via hole 79. Unless a gate contact via hole 79 is merged with a substrate contact via hole 69, the gate contact via hole 79 is vertically confined between the top surface of the contact-level dielectric layer 70 and the bottom surface of the contact-level dielectric layer 70.

Figure 12:
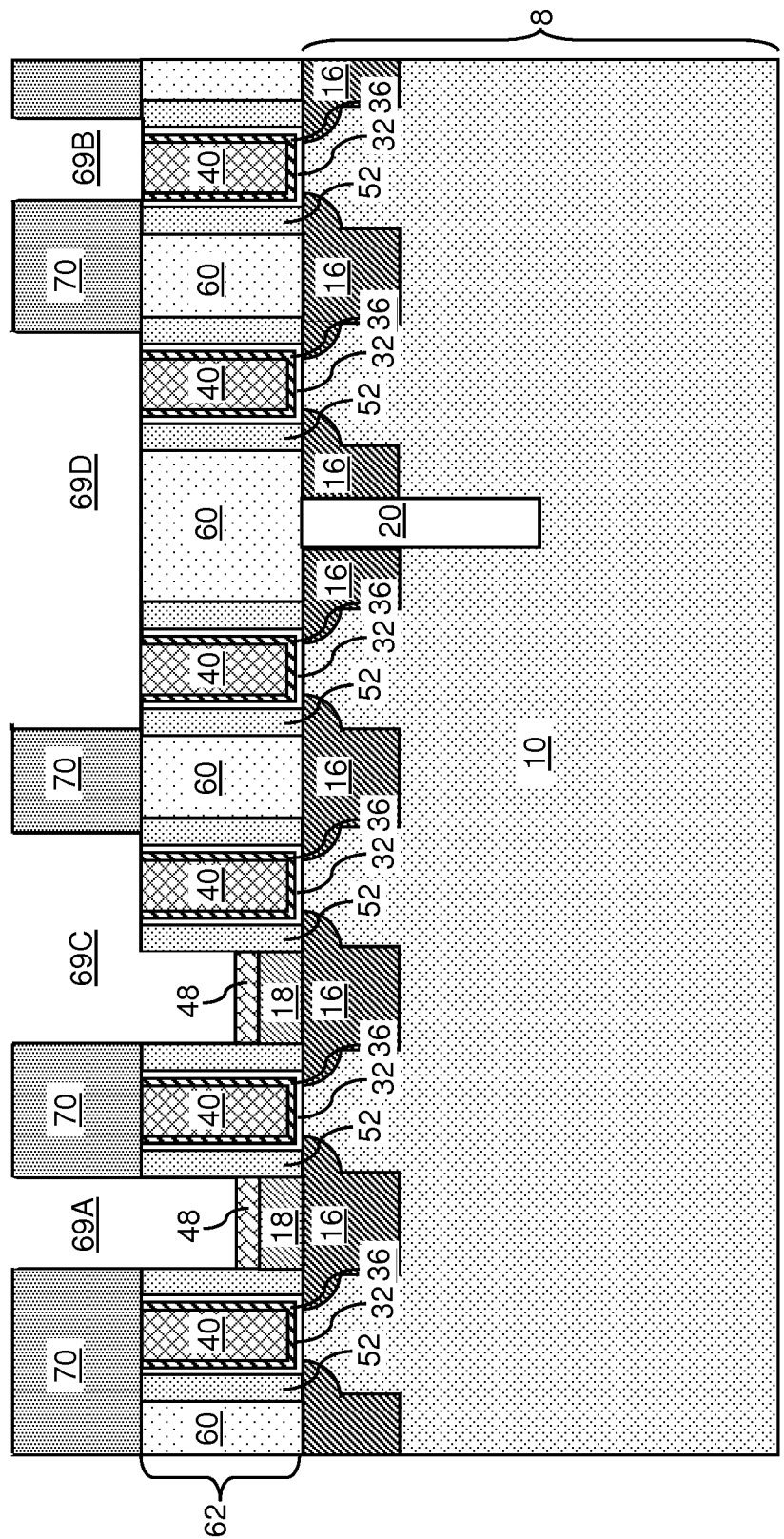
FIG. 12 is a vertical cross-sectional view of the exemplary semiconductor structure after removal of the second photoresist according to an embodiment of the present disclosure.

Referring to FIG. 12, the second photoresist 77 is removed, for example, by ashing. Various types of contact via holes are formed within the stack of the gate-level structure 62 and the contact-level dielectric layer. In an illustrative example, a first type contact via hole 69A overlies a metal semiconductor alloy portion 48, and does not overlie any replacement gate stack (32, 36, 40). The first type contact via hole 69A is a substrate contact via hole that stands alone and is not merged with any other contact via hole. The first type contact via hole 69A extends fully through the contact-level dielectric layer 70 and extends partly into the planarized dielectric layer 60 (if overlying a metal semiconductor alloy portion 48 located over a raised source/drain region 18), or fully through the planarized dielectric layer 60 (if overlying a metal semiconductor alloy portion located directly on the semiconductor material layer 10).

A second type contact hole via hole 69B overlies a single replacement gate stack (32, 36, 40), and does not overlie any metal semiconductor alloy portion 48. The second type contact via hole 69B is a gate contact via hole that stands alone, and is not merged with any other contact via hole. The second type contact via hole 69B extends fully through the contact-level dielectric layer 70, and does not extend into the planarized dielectric layer 60.

A third type contact via hole 69C overlies at least one metal semiconductor alloy portion 48 and a replacement gate stack (32, 36, 40). The third type contact via hole 69C is a combination of at least one substrate contact via hole 69 (See FIG. 10) and a gate contact via hole 79 (See FIG. 11). As such, the third type contact via hole 69C is a merged contact via hole of multiple contact via holes. The third type contact via hole 69C extends fully through the contact-level dielectric layer 70 and extends partly into the planarized dielectric layer 60 (if overlying a metal semiconductor alloy portion 48 located over a raised source/drain region 18), or fully through the planarized dielectric layer 60 (if overlying a metal semiconductor alloy portion located directly on the semiconductor material layer 10).

A fourth type contact hole via hole 69D overlies a plurality of replacement gate stacks (32, 36, 40), and does not overlie any metal semiconductor alloy portion 48. The fourth type contact via hole 69D is a gate contact via hole that contiguously extends over a plurality of replacement gate stacks (32, 36, 40) and at least one portion of the planarized dielectric layer 60 between or among the physically exposed replacement gate stacks (32, 36 40). The fourth type contact via hole 69D extends fully through the contact-level dielectric layer 70, and does not extends into the planarized dielectric layer 60.

Additional types of contact via holes can be formed within the contact-level dielectric layer 70 and optionally within the planarized dielectric layer. For example, another type of contact via holes that are contiguous over a plurality of replacement gate stacks (32, 36, 40) and at least one metal semiconductor alloy portion 48 can be formed. Other variations can also be employed in the geometries of the substrate contact via holes 69 (See FIG. 10), the gate contact via holes 79 (See FIG. 11), and the combinations thereof.

Figure 13:
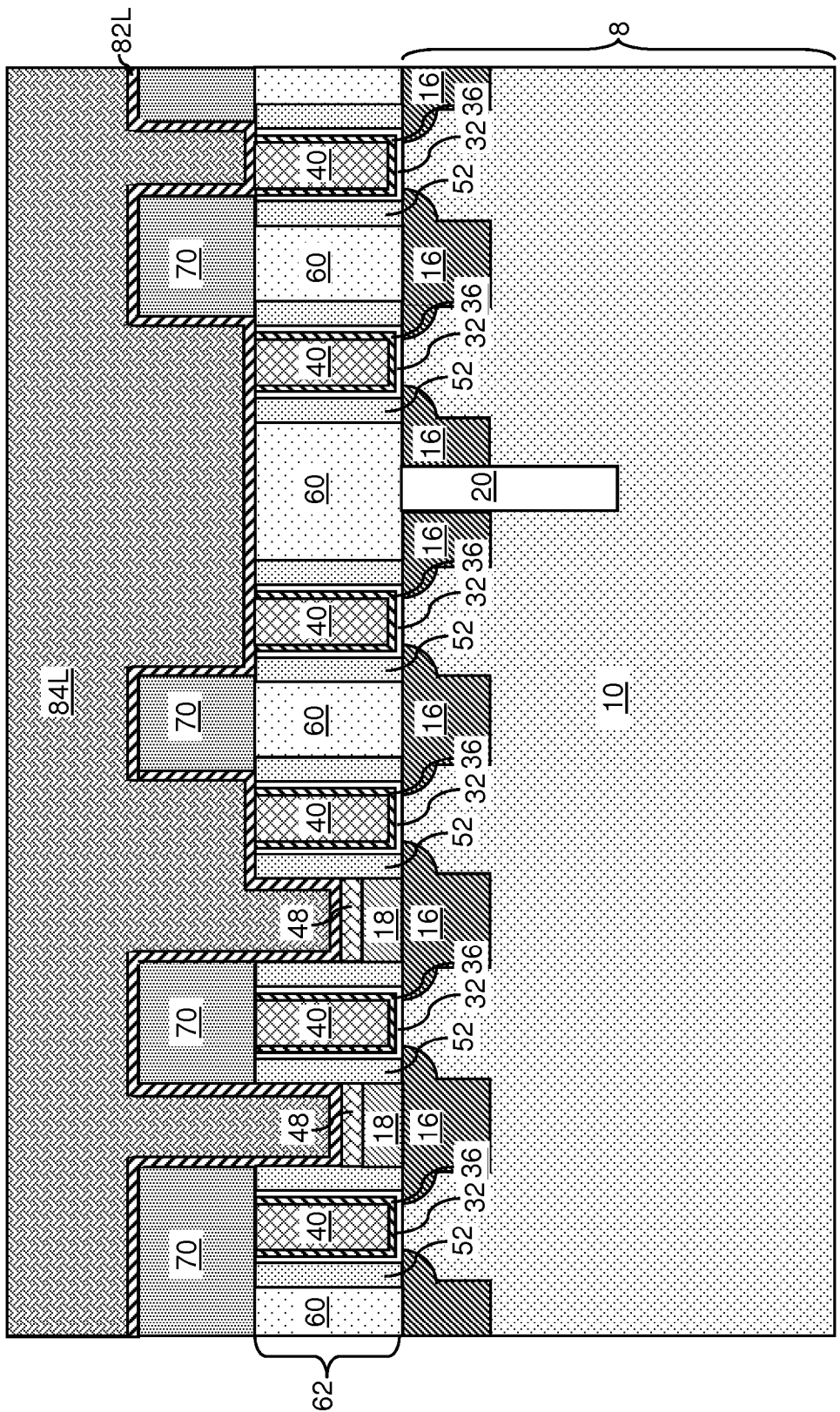
FIG. 13 is a vertical cross-sectional view of the exemplary semiconductor structure after deposition of a metallic barrier layer and a conductive material layer according to an embodiment of the present disclosure.

Referring to FIG. 13, a metallic barrier layer 82L and a conductive material layer 84L are sequentially deposited to fill the various contact via holes (69A, 69B, 69C, 69D) in the contact-level dielectric layer 70 and the gate-level structure 62.

The metallic barrier layer 82L includes a conductive metallic material that blocks metal diffusion therethrough. The metallic barrier layer 82L can include, for example, TiN, TaN, WN, TiC, TaC, WC, or a combination thereof. The metallic barrier layer 82L can be deposited, for example, by physical vapor deposition (PVD, sputtering), chemical vapor deposition (CVD), or a combination thereof. The thickness of the metallic barrier layer 82L, as measured at a horizontal portion above the top surface of the contact-level dielectric layer 70, can be from 1 nm to 20 nm, although lesser and greater thicknesses can also be employed.

The conductive material layer 84L includes a conductive metallic material having a high electrical conductivity. The conductive material layer 84L can include, for example, W, Ta, Ti, Al, Cu, and combinations thereof. In one embodiment, the conductive material layer 80L can include W, Ta, Ti, Al, and combinations thereof. In some embodiments, not using copper can result in enhanced leakage performance. The conductive material layer 84L can be deposited, for example, by physical vapor deposition (PVD, sputtering), chemical vapor deposition (CVD), electroplating, electroless plating, or a combination thereof. The thickness of the conductive material layer 84L, as measured at a horizontal portion above the top surface of the contact-level dielectric layer 70, can be from 30 nm to 600 nm, although lesser and greater thicknesses can also be employed.

Figure 14:
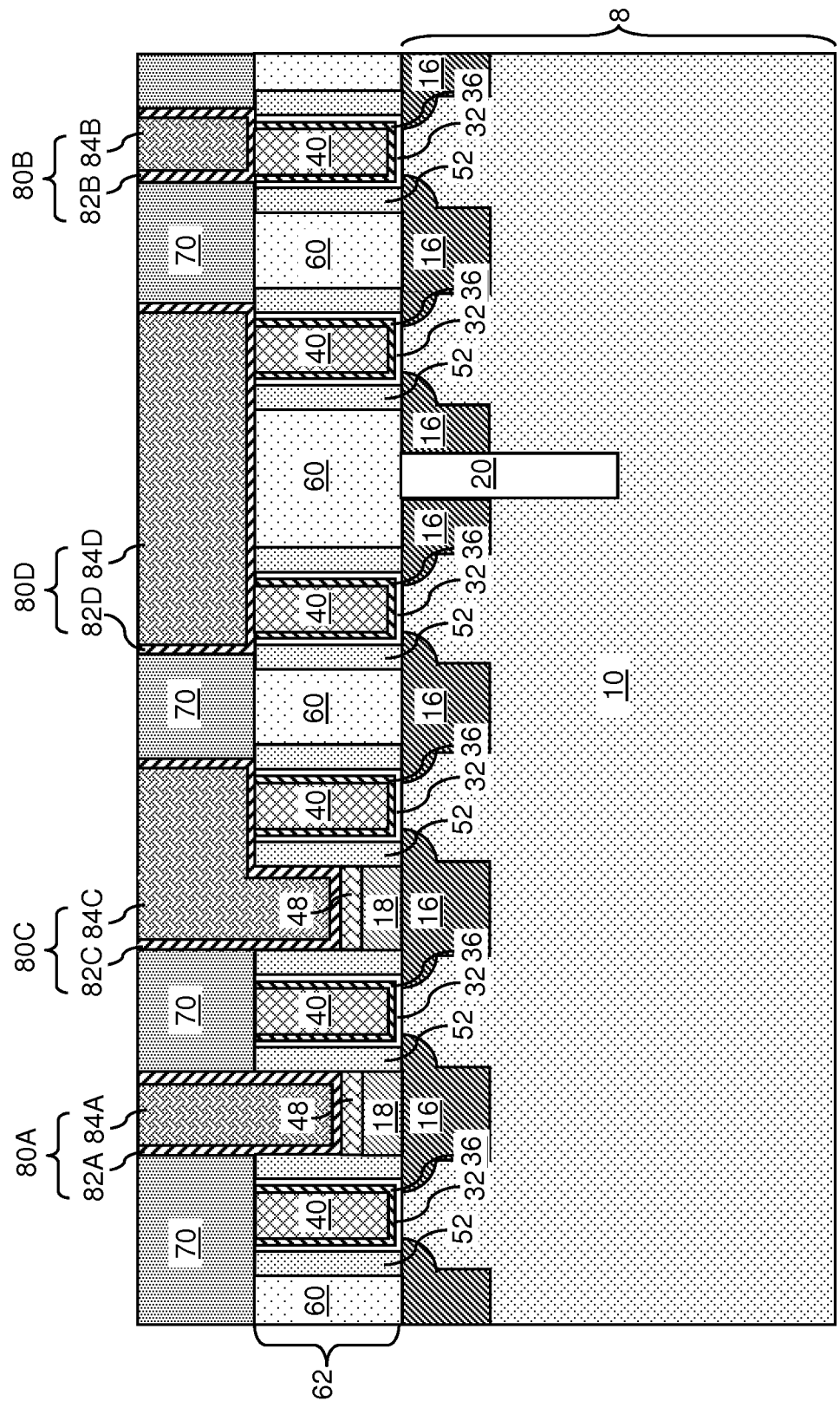
FIG. 14 is a vertical cross-sectional view of the exemplary semiconductor structure after deposition of substrate contact structures and gate contact structures by planarization of the metallic barrier layer and the conductive material layer according to an embodiment of the present disclosure.

Referring to FIG. 14, a planarization process is performed to remove the portions of the metallic barrier layer 82L and the conductive material layer 84L that are located above a planar top surface of the contact-level dielectric layer 70. The planarization process can employ, for example, chemical mechanical planarization (CMP) process. The CMP process can employ the top surfaces of the contact-level dielectric layer 70 as a stopping layer.

Various substrate contact structures and gate contact structures are formed by the planarization of the metallic barrier layer 82L and the conductive material layer 84L. In an illustrative example, a first type contact structure 80A physically contacts a metal semiconductor alloy portion 48, and does not physically contact any replacement gate stack (32, 36, 40). The first type contact structure 80A is a substrate contact structure that stands alone, and is not merged with any other contact structure. The first type contact structure 80A extends fully through the contact-level dielectric layer 70 and extends partly into the planarized dielectric layer 60 (if overlying a metal semiconductor alloy portion 48 located over a raised source/drain region 18), or fully through the planarized dielectric layer 60 (if overlying a metal semiconductor alloy portion located directly on the semiconductor material layer 10).

The first type contact structure 80A includes a stack of a first type metallic barrier portion 82A and a first type conductive material portion 84A. The first type metallic barrier portion 82A is a remaining portion of the metallic barrier layer 82L after the planarization process, and the first type conductive material portion 84A is a remaining portion of the conductive material layer 84L after the planarization process. The first type metallic barrier portion 82A contacts a metal semiconductor alloy portion 48, outer sidewalls of one or more gate spacers 52, and optionally top surfaces of one or more gate spacers 52, and does not contact a replacement gate structure (32, 36, 40). The first type conductive material portion 84A is embedded within the first type metallic barrier portion 82A, and contacts inner sidewalls and top surfaces of one or more horizontal portions of the first type metallic barrier portion 82A. Topmost surfaces of the first type metallic barrier portion 82A and the first type conductive material portion 84A are coplanar with the top surface of the contact-level dielectric layer 70.

A second type contact hole structure 80B physically contacts a single replacement gate stack (32, 36, 40), and does not physically contact any metal semiconductor alloy portion 48. The second type contact structure 80B is a gate contact structure that stands alone, and is not merged with any other contact structure. The second type contact structure 80B extends fully through the contact-level dielectric layer 70, and does not extend into the planarized dielectric layer 60.

The second type contact structure 80B includes a stack of a second type metallic barrier portion 82B and a second type conductive material portion 84B. The second type metallic barrier portion 82B is a remaining portion of the metallic barrier layer 82L after the planarization process, and the second type conductive material portion 84B is a remaining portion of the conductive material layer 84L after the planarization process. The second type metallic barrier portion 82B contacts a top surface of a replacement gate structure (32, 36, 40) and optionally a top surface of a gate spacer 52, and does not contact any metal semiconductor alloy portion 48. The second type conductive material portion 84B is embedded within the second type metallic barrier portion 82B, and contacts inner sidewalls and a top surface of a horizontal portion of the second type metallic barrier portion 82B. Topmost surfaces of the second type metallic barrier portion 82B and the second type conductive material portion 84B are coplanar with the top surface of the contact-level dielectric layer 70.

A third type contact structure 80C physically contacts at least one metal semiconductor alloy portion 48 and a replacement gate stack (32, 36, 40). The third type contact structure 80C is both a substrate contact structure and a gate contact structure. As such, the third type contact structure 80C is a merged contact structure of multiple contact structures. The third type contact structure 80C extends fully through the contact-level dielectric layer 70 and extends partly into the planarized dielectric layer 60 (if overlying a metal semiconductor alloy portion 48 located over a raised source/drain region 18), or fully through the planarized dielectric layer 60 (if overlying a metal semiconductor alloy portion located directly on the semiconductor material layer 10). Thus, a substrate contact structure and a gate contact structure are formed as a single contiguous contact structure that is embodied as the third type contact structure 80C. The third type contact structure 80C functions as a local interconnect structure that is located below the top surface of the contact-level dielectric layer 70 and provides a conductive path between a replacement gate structure (32, 36, 40) and at least one metal semiconductor alloy portion 48.

The third type contact structure 80C includes a stack of a third type metallic barrier portion 82C and a third type conductive material portion 84C. The third type metallic barrier portion 82C is a remaining portion of the metallic barrier layer 82L after the planarization process, and the third type conductive material portion 84C is a remaining portion of the conductive material layer 84L after the planarization process. The third type metallic barrier portion 82C contacts at least one top surface of at least one metal semiconductor alloy portion 48, outer sidewalls and at least one top surface of gate spacers 52, and a top surface of a replacement gate structure (32, 36, 40) and optionally a portion of the top surface of the planarized dielectric layer 60. The third type conductive material portion 84C is embedded within the third type metallic barrier portion 82B, and contacts inner sidewalls, a top surface of a first horizontal portion of the third type metallic barrier portion 82A located above the top surface of the planarized dielectric layer 60, and a top surface of at least one second horizontal portion of the third type metallic barrier portion 82A located below the top surface of the planarized dielectric layer 60. Topmost surfaces of the third type metallic barrier portion 82C and the third type conductive material portion 84C are coplanar with the top surface of the contact-level dielectric layer 70.

A fourth type contact hole structure 80D physically contacts a plurality of replacement gate stacks (32, 36, 40), and does not physically contact any metal semiconductor alloy portion 48. The fourth type contact structure 80D is a gate contact structure that contiguously extends over a plurality of replacement gate stacks (32, 36, 40) and at least one portion of the planarized dielectric layer 60 between or among the physically exposed replacement gate stacks (32, 36 40). The fourth type contact structure 80D extends fully through the contact-level dielectric layer 70, and does not extends into the planarized dielectric layer 60. The fourth type contact structure 80D functions as a local interconnect structure that is located below the top surface of the contact-level dielectric layer 70 and provides a conductive path between, or among, a plurality of replacement gate structures (32, 36, 40).

The fourth type contact structure 80D includes a stack of a fourth type metallic barrier portion 82D and a fourth type conductive material portion 84D. The fourth type metallic barrier portion 82D is a remaining portion of the metallic barrier layer 82L after the planarization process, and the fourth type conductive material portion 84D is a remaining portion of the conductive material layer 84L after the planarization process. The fourth type metallic barrier portion 82D contacts a top surface of a plurality of replacement gate structures (32, 36, 40), top surfaces of gate spacers 52, and a portion of the top surface of the planarized dielectric layer 60 located between, or among, the plurality of replacement gate structures (32, 36, 40). The fourth type metallic barrier portion 82D does not contact any metal semiconductor alloy portion 48. The fourth type conductive material portion 84D is embedded within the fourth type metallic barrier portion 82D, and contacts inner sidewalls and a top surface of a horizontal portion of the fourth type metallic barrier portion 82D. Topmost surfaces of the fourth type metallic barrier portion 82D and the fourth type conductive material portion 84D are coplanar with the top surface of the contact-level dielectric layer 70.

Additional types of contact structures can be formed within the contact-level dielectric layer 70 and optionally within the planarized dielectric layer. For example, another type of contact structures that physically contact a plurality of replacement gate stacks (32, 36, 40) and at least one metal semiconductor alloy portion 48 can be formed. Other variations can also be employed in the geometries of the substrate contact structures (80A, 80C) and the gate contact structures (80B, 80C, 80D).

Figure 15:
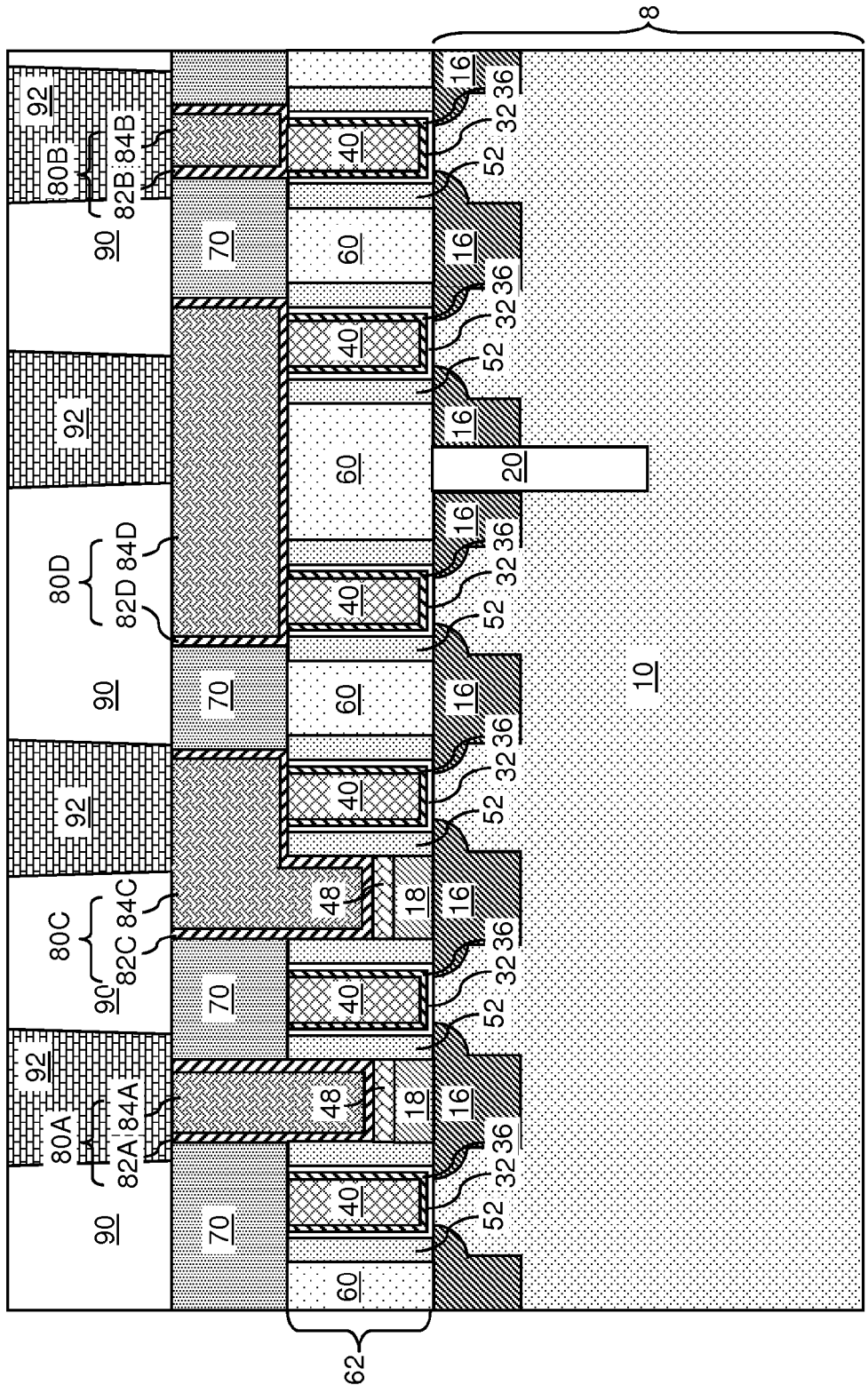
FIG. 15 is a vertical cross-sectional view of the exemplary structure after deposition of an interconnect-level dielectric layer and formation of interconnect-level conductive structures according to an embodiment of the present disclosure.

Referring to FIG. 15, an interconnect-level dielectric layer 90 comprising a dielectric material is formed over the contact-level dielectric layer 70. The interconnect-level dielectric layer 90 includes a dielectric material such as organosilicate glass, silicon nitride, and/or doped or undoped silicon oxide. The interconnect level dielectric layer 90 can be deposited, for example, by chemical vapor deposition (CVD) or spin coating. The thickness of the interconnect level dielectric layer 90 can be from 100 nm to 1,000 nm, although lesser and greater thicknesses can also be employed.

Various interconnect-level conductive structures 92 are formed within the interconnect-level dielectric layer 90 by forming openings within the interconnect-level dielectric layer 90, filling the openings with a conductive material, and removing excess conductive material above the top surface of the interconnect-level dielectric layer 90. The various interconnect-level conductive structures 92 can be contact via structures that provide vertical electrically conductive paths, or can be a conductive line structures that provide horizontal electrically conductive paths, or a combination thereof. Additional interconnect-level dielectric layers (not shown) and additional interconnect-level conductive structures (not shown) can be formed above the interconnect-level dielectric layer 90 as known in the art.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
    gate structures including a stack of a gate dielectric and a gate electrode and located on a semiconductor substrate;
    a dielectric layer located on said semiconductor substrate, wherein top surfaces of said gate structures are coplanar with a top surface of said dielectric layer;
    a contact-level dielectric layer located over said dielectric layer and said gate structures;

a metal semiconductor alloy portion located on a semiconductor material;
a substrate contact structure embedded in said contact-level dielectric layer and in contact with said metal semiconductor alloy portion and at least one of said gate spacers; and
a gate contact structure embedded in said contact-level dielectric layer and in contact with a top surface of one of said gate electrodes, wherein said gate contact structure is in contact with another of said gate electrodes and overlies a portion of said planarized dielectric layer between said one of said gate electrodes and said another of said gate electrodes.

2. The semiconductor structure of claim 1, wherein said semiconductor material is a raised source region or a raised drain region that is epitaxially aligned to a single crystalline semiconductor material within said semiconductor substrate.

3. The semiconductor structure of claim 1, wherein said gate dielectric is a U-shaped gate dielectric comprising a dielectric material having a dielectric constant greater than 8.0 and having vertical portions having top surfaces that are coplanar with a top surface of said planarized dielectric layer.

4. The semiconductor structure of claim 1, wherein said substrate contact structure and said gate contact structure comprise a same conductive material.

5. The semiconductor structure of claim 1, wherein said substrate contact structure and said gate contact structure are merged with each other and constitute a single contiguous contact structure.

6. A semiconductor structure comprising:
gate structures including a stack of a gate dielectric and a gate electrode and located on a semiconductor substrate;
a dielectric layer located on said semiconductor substrate, wherein top surfaces of said gate structures are coplanar with a top surface of said dielectric layer;
a contact-level dielectric layer located over said dielectric layer and said gate structures;
a metal semiconductor alloy portion located on a semiconductor material;
a substrate contact structure embedded in said contact-level dielectric layer and in contact with said metal semiconductor alloy portion and at least one of said gate spacers, wherein said substrate contact structure and said gate contact structure are merged with each other and constitute a single contiguous contact structure; and
a gate contact structure embedded in said contact-level dielectric layer and in contact with a top surface of one of said gate electrodes.

7. The semiconductor structure of claim 6, wherein said semiconductor material is a raised source region or a raised drain region.

8. The semiconductor structure of claim 7, wherein said semiconductor material is epitaxially aligned to a single crystalline semiconductor material within said semiconductor substrate.

9. The semiconductor structure of claim 6, wherein said gate dielectric is a U-shaped gate dielectric.

10. The semiconductor structure of claim 9, wherein said gate dielectric comprises a dielectric material having a dielectric constant greater than 8.0 and having vertical portions having top surfaces that are coplanar with a top surface of said planarized dielectric layer.

11. The semiconductor structure of claim 6, wherein said substrate contact structure and said gate contact structure comprise a same conductive material.

12. The semiconductor structure of claim 6, wherein said gate contact structure is in contact with another of said gate electrodes and overlies a portion of said planarized dielectric layer between said one of said gate electrodes and said another of said gate electrodes.

* * * * *